United States Patent [19]

Vermesse

[11] Patent Number: 4,984,191

[45] Date of Patent: Jan. 8, 1991

[54] LIMITED WRITE NON-VOLATILE MEMORY AND A FRANKING MACHINE MAKING USE THEREOF

[75] Inventor: Bernard Vermesse, L'Hay les Roses, France

[73] Assignee: SMH Alcatel, Paris, France

[21] Appl. No.: 174,759

[22] Filed: Mar. 29, 1988

[30] Foreign Application Priority Data

Mar. 31, 1987 [FR] France .................. 87 04478

[51] Int. Cl.$^5$ ................................. G07B 17/00
[52] U.S. Cl. .................. 364/900; 364/464.02; 377/16
[58] Field of Search ............. 364/464.02, 464.03, 364/900; 377/16

[56] References Cited

U.S. PATENT DOCUMENTS

| | | | |
|---|---|---|---|
| 4,090,258 | 5/1978 | Cricchi | 365/184 |
| 4,280,180 | 7/1981 | Eckert et al. | 364/464.02 |
| 4,335,434 | 6/1982 | Baumann et al. | 364/464.02 |
| 4,611,282 | 9/1986 | McFiggans | 364/900 X |
| 4,651,307 | 3/1987 | Toumayan et al. | 365/226 X |
| 4,710,888 | 12/1987 | Burke et al. | 364/561 |
| 4,803,646 | 2/1989 | Burke et al. | 364/561 |
| 4,803,707 | 2/1989 | Cordan, Jr. | 364/561 X |

FOREIGN PATENT DOCUMENTS

| | | |
|---|---|---|
| 0131343 | 1/1985 | European Pat. Off. . |
| 0172574 | 2/1986 | European Pat. Off. . |
| 3517087 | 11/1986 | Fed. Rep. of Germany . |
| 2466834 | 4/1981 | France . |

OTHER PUBLICATIONS

Patent Abstracts of Japan, vol. 8, No. 68 (P-1505) Mar. 30, 1984; & JP-1-58 215 794 (Tokyo Shibaura Denki K.K.) 15-12-1983.

*Primary Examiner*—Parshotam S. Lall
*Assistant Examiner*—Edward R. Cosimano
*Attorney, Agent, or Firm*—Sughrue, Mion, Zinn, Macpeak & Seas

[57] ABSTRACT

The limited write non-volatile memory is characterized in that it is constituted by a limited memory space (1) in an EEPROM which is organized as a first zone (5) for recording the more significant bits of successive data sets at fixed addresses, and a second zone (6) for recording at least the remaining less significant bits of said data sets at addresses which change around a closed loop of addresses, said less significant bits being recorded with at least one redundancy bit which is common both to the more significant bits recorded in the first zone and the less significant bits recorded in the second, said memory being under the control of a programmed circuit for processing and addressing control. Said memory space constitutes the meter memory (CA, CD, CT) of a franking machine.

18 Claims, 6 Drawing Sheets

LIMITED WRITE NON-VOLATILE MEMORY AND A FRANKING MACHINE MAKING USE THEREOF

REFERENCE TO RELATED APPLICATIONS

This application is related to concurrently filed and commonly assigned application Ser. No. 174,756 entitled "A COUPLING CIRCUIT FOR NON-VOLATILE MEMORIES IN AN ELECTRONIC MACHINE, AND A FRANKING MACHINE APPLYING SAID CIRCUIT", now U.S Pat. No. 4,916,626, and application Ser. No. 174,755, also concurrently filed and commonly assigned.

The present invention relates to non-volatile memories used for recording successive data relating to a franking machine. It relates in particular to a limited write non-volatile memory used for recording postal data in a franking machine and thus constituting the machine's meter memory.

BACKGROUND OF THE INVENTION

Depending on country, the franking machines currently on the market are either post-payment machines for performing franking operations during a certain period of time, or else pre-payment machines for performing franking operations up to an amount of credit loaded into the machine.

The postal data of the machine is constituted in both cases by the total value of the franking operations performed, and for prepayment machines only, by the amount of usable credit remaining in the machine. This data must be accounted very reliably and must be capable of being checked so as to avoid fraud.

As franking operations are performed by a franking machine, an up meter gives the total value of the franking performed. And as postal values are printed, a down meter gives the value of the remaining credit. A cumulative meter gives the total value of the amounts of credit successively loaded into the machine, and is associated with the up and down meters for performing arithmetic checks on the postal data per se.

Each time credit is loaded into the machine, the state of the down meter and the state of the cumulative meter are increased by the amount of the credit. Each time a franking operation is performed, the value of the franking operation is added to the up meter and subtracted from the down meter. The up and down meters therefore change each time a franking operation is performed.

The down meter also serves to lock the machine when insufficient credit remains.

Post-payment franking machines are also equipped with these three meters: up meter, down meter, and cumulative meter. Credit is not loaded into the machine, so the down meter also cumulates the successive franking operation amounts, taken as negative values, and the cumulative meter remains at zero.

In electronic systems for postal data accounting in a franking machine, these meters are constituted by a microcomputer and a non-volatile memory. The operations of updating the total value of franking operations performed and/or the value of the credit remaining are performed by the microcomputer each time a franking operation is performed or each time the machine is reloaded. The memory records the resulting new meter values. These successive values are recorded on m bits, where m is compatible with the maximum value the meter is allowed to reach. This memory is commonly referred to as the "meter" memory or simply the "meters" of a franking machine.

For reasons of operating security, the up, down, and cumulative meters may be doubled up. The data contained in corresponding meters must coincide, and noncoincidence between the meters is used to prevent any further franking operation and to lock up the machine.

For the same reasons, the cumulative meter is associated with the up meter and the down meter. The cumulative meter is used for recording the total value of credit ever loaded into the machine. It serves to provide internal arithmetic checking on proper machine operation, since its contents must always be equal to the sum of the contents of the up meter and the down meter.

In electronic machines, the meter-constituting memory(ies) must satisfy two requirements in particular. Firstly the recorded data must be stored even when the machine is switched off or there is a failure in the machine power supply. Secondly the memory must be capable of being subjected to a number of write cycles which is not less than the number of franking cycles which the machine can perform. In addition, account must be taken of the credit reloading cycles since these cause new values to be written in the up meter and the cumulative meter, but the total number of credit reloading cycles remains relatively much less than the number of franking cycles.

Electronically erasable programmable read only memories (EEPROM) satisfy the first requirement. However, the number of write cycles to which they can be subjected is insufficient in normal operation of the memory, even for the commonest average capacity franking machines on the market.

That is why random access memories (RAM) which can be subjected to an indefinite number of write cycles are used. In order to satisfy the first requirement, they are backed up by a battery which provides the energy they require when the machine is switched off or when its power supply fails.

The use of a battery-backed RAM has a limited lifetime because of the battery. It also requires that the state of the battery be continuously monitored and the battery needs changing from time to time.

The use of a battery also requires auxiliary components to be associated therewith. Such auxiliary components reduce machine reliability. In particular, a fault in one of the auxiliary components may short-circuit the battery, thereby losing all the stored data. A mechanical shock or an accidental increase in temperature may cause battery sealing to rupture by causing its sealed envelope to tear, thereby damaging the battery and possibly releasing various toxic substances into the surrounding atmosphere.

The object of the present invention is to avoid these drawbacks.

SUMMARY OF THE INVENTION

The present invention provides a limited write non-volatile memory for recording successive data sets each comprising m bits, and each having the possibility of being renewed R times, the memory being characterized in that it comprises a memory device which can be addressed for a maximum number E of times for writing at each address, said memory having a limited memory space attributed to said data sets and defining a capacity which is less than the capacity required for renewing said data sets R times, in that said limited memory space is organized as a first zone for recording n of the m bits in each data set at first fixed addresses in said first zone, said n bits requiring renewing fewer than E times, and a second zone for recording the remaining m−n bits in each data set at second, variable addresses within said second zone, together with at least one of the n bits of the set under consideration, referred to as a redundancy bit, and in that it further includes a programmed circuit for processing and controlling the addressing of said limited memory space, said circuit controlling the designation of said first fixed addresses on each occasion that said n bits are renewed to cause the new n bits to be recorded in the place of the preceding bits, and also causing said second, variable addresses to progress around a closed loop sequence including all of said second addresses on each occasion that a new data set is to be recorded in order to designate the new second addresses in said second zone in which said m−n bits together with at least one associated redundancy bit are to be recorded.

According to a characteristic of the invention, said programmed circuit further includes means for counting the number of complete successive loops through said sequence of said variable second addresses, thereby constituting a wear meter.

The invention also provides a franking machine including means for generating the successive total values of the franking operations performed, said machine being characterized in that said limited memory space constitutes the up meter memory of the franking machine, for which the successive total values of the franking operations performed constitute said successive data sets, and in which said programmed circuit includes means for locking said machine when said wear meter reaches the maximum number E of writes.

According to another characteristic of the invention, said limited memory space also constitutes the down meter memory of the franking machine for which the successive values of remaining credit associated with the successive franking values form successive meter value pairs which constitute said successive data sets, in that said first zone is organized for consecutive recording of at least one most significant byte of each of the values in a pair at said first fixed addresses, and in that said second zone is subdivided into an integer number of mutually identical two-meter compartments for consecutively recording at least the remaining less significant bits of both values in a given pair.

According to another characteristic of the invention, the successive remaining credit values and the successive franking totals are each recorded in association with an error detection word specific thereto.

According to another characteristic, said limited memory space is a 256 byte space in a serial access EEPROM, in which said first zone comprises the following at fixed addresses: a compartment for a credit cumulative meter; a wear compartment for recording the extent to which the memory itself has been used up; and a two-meter compartment containing a portion of the up meter and a portion of the down meter, in the form of the most significant byte of each of them; and in which said second zone comprises an integer number of identical two-meter (up and down) compartments which are associated successively with said first zone two-meter compartment for containing the successive states of said meters.

BRIEF DESCRIPTION OF THE DRAWINGS

An embodiment of the invention is described by way of example with reference to the accompanying drawings, in which.

MORE DETAILED DESCRIPTION

Figure 1:
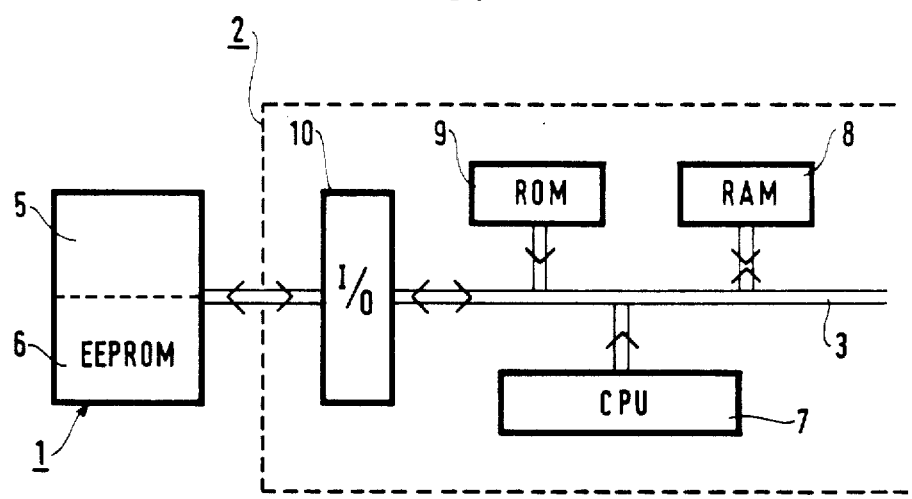
FIG. 1 is a block diagram showing said non-volatile memory in accordance with the invention.

FIG. 1 shows a non-volatile memory in accordance with the invention which is capable of recording successive data sets in a limited memory space assigned to said data sets, in spite of being a limited write memory.

This non-volatile memory comprises an EEPROM 1 in which the number of authorized write operations that may be performed at any address is limited to a maximum number E. The figure diagrammatically represents the limited memory space attributed to recording the data sets (which memory space is also referred to by the reference 1 below), together with a processor circuit 2 which controls the addressing of said limited memory space 1.

The successive data sets relate to a machine (not shown) to which the non-volatile memory is directly coupled. The data sets are transmitted to the non-volatile memory over an internal bus 3. They comprise m bits per set and the number of times they may be renewed during the expected period of machine use is R. For this period of machine use, the memory space 1 in the EEPROM is of too small capacity to record R × m bits, given the limited number of units authorized at any address, which number E is about 10,000 writes per address.

Figure 2:
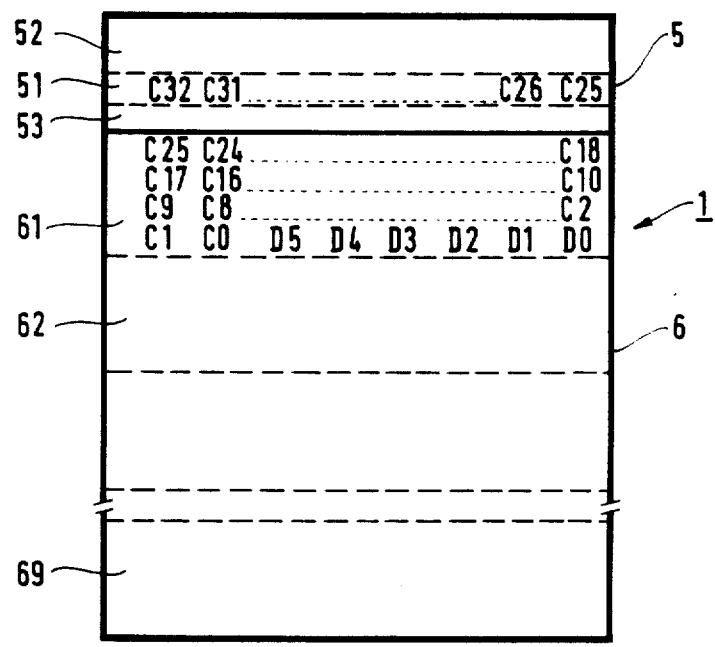
FIG. 2 is a diagram showing a first organization of the FIG. 1 memory space.
Figure 3:
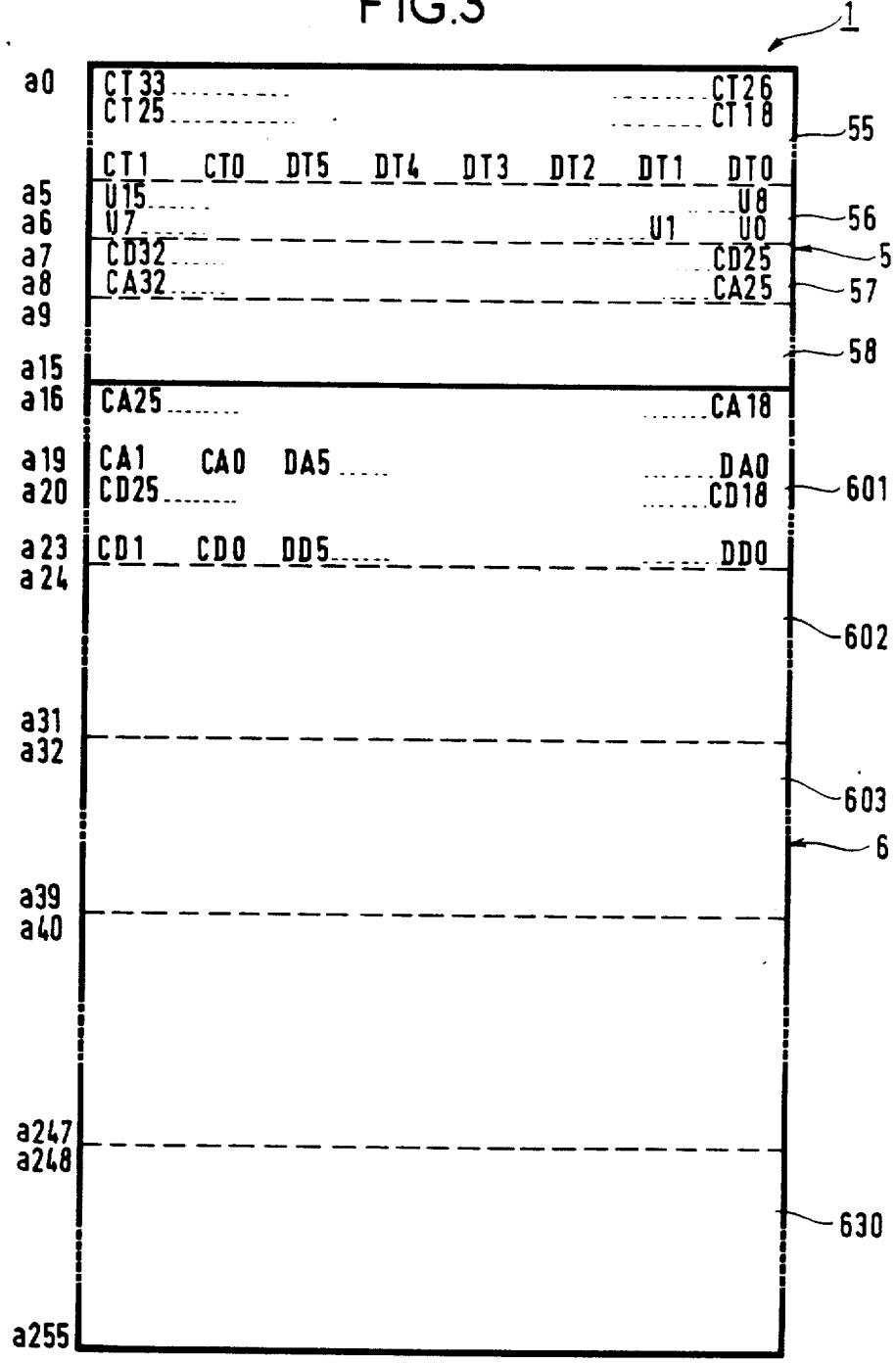
FIG. 3 is a diagram showing a second organization of the FIG. 1 memory space for application as a meter memory in a franking machine.

In order to overcome this limitation on the number of writes, the memory space 1 is subdivided into two zones 5 and 6 as shown diagrammatically in FIGS. 2 and 3. The zone 5, or at least a portion thereof, is attributed to recording a portion of the bits in each data set, i.e. n bits taken from the m in each data set, at fixed addresses. With these n bits being renewed by fewer than the maximum number E of writes possible at said fixed addresses during the R renewals of the data sets. The zone 6 is a zone attributed to writing at variable addresses within said zone at least the remaining bits in each set, i.e. the m−n bits of the set under consideration, together with at least one of the bits already recorded in the zone 5 and referred to as the "redundancy" bit.

The circuit 2 for processing and controlling the addressing of said memory space 1 is a programmed circuit. It comprises a processing microcomputer 7 coupled to the bus 3 which is associated with a RAM 8 for generating control data and operating, in particular, as an address pointer, and a programmed read only memory (ROM) 9, together with input/output (I/O) circuits 10 for providing interface coupling with the memory space 1. The circuit 2 is clocked by a crystal clock (not shown).

The diagram of FIG. 2 shows the organization of the memory space 1 in the event that each data set is the total value of franking operations performed by a franking machine, and is defined on 33 bits referenced C0 to C32 (m=33), to be recorded under the control of the processing and address control circuit 2.

Processing is performed in bytes. The most significant byte constituted by the eight bits C32 to C25 in said meter value is recorded in the zone 5 at fixed address for said byte which may take on all possible successive values. The remaining 25 bits: C24 to C0, accompanied by the next most significant bit: C25 as already attributed to the zone 5, are recorded in the zone 6.

Advantageously, the recording of the 33 bits C0 to C32 with the bit 25 being recorded twice over, once in the zone 5 and once in the zone 6 of the memory space 1, is associated with an error detection word that is directly related to the corresponding meter value. The error detection word under consideration is defined on six bits referenced D0 to D5 and is recorded, together with the bits C0 to C25, in the zone 6.

The error detection word is advantageously obtained by dividing the meter value under consideration by an irreducible polynomial. The polynomial used is preferably the primitive and irreducible three term-polynomial: $X^6+X+1$. It can be used to detect errors on meters each capable of being expressed on up to 63 bits. The error detection word is constituted by the remainder of said division, taken on six bits, and recorded with the meter value in memory space 1. As is known, such an error detection word can be used to detect any one-bit inversion error or a change in a group of bits. The meter value read in the memory is validated by dividing it by the irreducible polynomial and by comparing the remainder of said division with the error detection word recorded therewith.

Naturally, the degree of error detection is related to the length selected for the associated error detection word, and in the example described, this length is 6 bits.

Reference 51 relates to the fixed location, defined by its fixed addresses, for recording the most significant byte C32 to C25 of a meter value in the zone 5. Reference 52 in the same zone 5 designates a fixed location for recording special information, advantageously data concerning the extent to which the non-volatile memory has been used up, which data is described below, and there is an additional fixed location 53 which is spare.

In zone 6, reference 61 designates the location, occupying a set of addresses, which is occupied by the bits relating to the meter value which has just been recorded together with the bits of its error detection word. References 62, . . . , 69 designate other successive locations identical to location 61, and each occupying its own set of addresses, these locations being suitable for receiving the bits corresponding to successive meter values associated with their error detection words.

In association with this organization of the memory space 1, the programmed circuit 2 for processing and controlling addressing performs the following operations for each newly received meter value:
the byte recorded at fixed location 51 is compared with the new corresponding byte, and only if the bytes are different is the old byte deleted and the new byte recorded at the same location 51;
the error detection word associated with the new meter value is calculated; and
the recording location in zone 6 is advanced by one location, i.e. going from previously considered location 61 to the following location 62, with the advance corresponding to one set of location addresses, and after the new location 62 has been initially erased, the relevant bits of the new meter value together with the error detection word are written therein.

This progression through the recording locations for successive meter values in the zone 6 takes place on each occasion successive meter values are received, by providing, a corresponding progression in the write addresses in the zone 6 along the continuing sequence of address which constitute the addresses of an integer number of such locations in the zone 6. This progression of write addresses over the entire continuous sequence corresponds to one recording cycle in all of the locations in the zone 6. When the last location in the zone 6 is reached in this way, thus corresponding to one complete recording cycle, the next meter value is recorded in the first location of the zone 6 after it has been erased, thereby initiating a new recording cycle. This passage from one recording cycle to the next is obtained by considering the continuous series of location addresses in the zone 6 as being looped on itself, with the addresses following one another around a closed loop defined thereby.

The RAM 8 operates as a looped count up register referred to as the address register or the address pointer and it delivers the addresses of successive compartments in the zone 6 over a recording cycle in said zone followed by the address of the first compartment in said zone 6 at the end of each cycle in order to begin a new recording cycle. On passing through zero, i.e. through its minimum count state, corresponding to the address 61 of the first compartment in the zone 6, i.e. each time a recording cycle is begun, a memory wear register associated with the address register advances by one position. This wear register counts the recording cycles in the zone 6.

The state of the wear register defines the wear of the zone 6 and it is recorded as wear data in the zone 5 in fixed address compartment 52. When it reaches the number E, then E writes will have been performed in each address of the zone 6. The EEPROM 1 should then be considered as being worn out. When the wear data reaches the value of E recording cycles performed, the machine to which the memory 1 is coupled is itself locked out of operation.

Compartment 52 is selected to have a capacity equal to two bytes in order to be able to record successive wear data words that may rise to the value E, where E=10,000.

A memory space 1 controlled in the manner described above constitutes the meter memory of a franking machine. This memory does not need a back-up power supply, and its degree of wear is measured over time. When the wear value reaches E, the machine locks up and its meter memory must be changed.

FIG. 3 illustrates the organization of the limited memory space 1 of the FIG. 1 non-volatile memory for use as a meter memory in a franking machine. This organization of the memory space 1 is given for use with franking machines of a type suitable for meeting most market requirements, i.e. a machine that enables the user to perform 100 franking operations per day for 300 days in the year over a period of ten years, and operating at a franking rate which is less than 1,000 letters or labels per hour.

The memory space 1 for the up meter, the down meter, and the cumulative meter is selected to have 256 bytes, given respective byte addresses a0 to a255. Each meter value to be stored occupies 32 bits referenced CA32 to CA0, for the up meter and referenced CD32 to CD0 for the down meter. The cumulative meter occupies 34 bits which are referenced CT33 to CT0.

Each of the meter values is recorded together with its 6-bit error detection word, having bits referenced DA0 to DA5, DD0 to DD5, or DT0 to DT5, depending on the meter concerned.

As in FIG. 2, the memory space 1 is divided into two zones, one of which is given the same reference 5 and serves for recording at fixed addresses and the other of which is given the same reference 6 and serves for recording at varying addresses.

The zone 5 covers addresses a0 to a15 inclusive. It is itself subdivided into compartments attributed to recording data which differs in type from one compartment to another. These various compartments are as follows:

- a 5-byte cumulative meter compartment 55 occupying addresses a0 to a4 for recording the cumulative meter expressed on 34 bits CT together with its 6-bit error detection word DT0 to DT5;
- a 2-byte wear compartment 56 occupying addresses a5 and a6 for recording the number of recording cycles that have taken place in zone 6, said total being expressed on 16 bits referenced U0 to U15 in order to express a number of cycles that may reach E writes per address in the memory space 1 where E=10,000;
- a 2-byte two-meter compartment 57 containing a portion of the up meter and a portion of the down meter, said compartment occupying addresses a7 and a8 and serving to record the most significant byte CD32 to CD25 of the down meter and the most significant byte CA32 to CA25 of the up meter; and
- a 7-byte spare compartment 58 occupying addresses a9 to a15.

The zone 6 extends from address a16 to address a255. It is divided into 30 mutually identical two-meter compartments 601 to 630. Each of these 30 two-meter compartments occupies eight bytes. They follow one another at respective addresses a16 to a23, a24 to a31, . . . , a248 to a255, which are considered as constituting a continuous sequence of addresses. These 30 two-meter compartments are all used for recording data of the same type, namely the remaining bits CA24 to CA0 and CD24 to CD0 of the up and down meters, together with the corresponding redundancy bits CA25 and CD25, and the corresponding error detection words DA0 to DA5 and DD0 to DD5. They are written to one after the other with the two-meter compartment concerned being initially erased prior to writing. During one recording cycle these compartments are written to in sequence each time the up and down meters change value until all of zone 6 has been written to, and then at the end of the cycle a new cycle is started, identical to the previous cycle.

The circuit for processing the meter values and for addressing the FIG. 3 memory space 1 is identical to the circuit shown in FIG. 1. In practice, it will merely be associated with the microprocessor of the franking machine and will constitute an extra portion thereof for functions relating to the organization of the memory space 1.

The functions of the circuit for processing the meters and addressing memory space 1 are comparable to those mentioned above with respect to the memory space organization shown in FIG. 2, i.e.:

firstly the following are addressed on a fixed address basis:

the cumulative meter compartment 55 is addressed each time this meter changes value in order to record the new value as a replacement for the old value;

the wear compartment 56 is changed each time the wear data generated by the RAM 8 changes, and each newly recorded wear data word replaces the preceding word; and the partial down meter and partial up meter compartment 57 is altered each time the most significant byte in either or both of the meters changes value with the new byte for one of the meters being written in conjunction with a copy of the old byte of the other meter (when credit is being reloaded) or with a new byte being written to both meters (during franking), depending on circumstances and to replace the preceding bytes;

and secondly, it addresses the 30 compartments of the zone 6 sequentially around a closed loop, each time there is a change in value in one or other of the two corresponding meters, in order to record two new bit sets CA25 to CA0 and CD25 to CD0 together with the corresponding error detection words DA0 to DA5 and DD0 to DD5 in the currently addressed one of the 30 compartments.

The EEPROM used is preferably a serial access memory sold by XICOR Corporation, such as its type X24C04 having a capacity of 512 bytes organized as two pages each of 256 bytes. One of these two pages constitutes the memory 1 for the up meter, the down meter, and the cumulative meter.

In a variant, the EEPROM memory space used may have a capacity of less than 256 bytes or it may be greater, e.g. 512 bytes, . . . , 2048 bytes. The number of compartments in the variable addressing zone is selected as a function of the expected number of franking operations which the machine can perform during its utilization lifetime. Thus, a franking machine having a memory space of 2048 bytes for the machine meters, giving 254 compartments in its variable addressing zone, could be used for performing 25,400,000 franking operations.

Similarly, the memories could be capable of accepting a larger number of write operations, for example they might accept 20,000 writes instead of 10,000, in which case a memory space having half as many compartments in the variable addressing zone, e.g. 15 instead of the 30 mentioned above, could suffice.

Naturally, a parallel access EEPROM could be used instead of a serial access memory. The only difference would then lie in the data transfer protocol, while the organization of the memory would be the same.

The serial access memory 1 is connected to to the circuit 2 for processing and controlling addressing (FIG. 1) over two wires which are connected to the I/O circuits 10. One of these two wires conveys:

read or write commands in bytes or groups of eight bytes;

beginning of read or write addresses; and the data to be read or written.

This link is a two-way link. Transmission over this link wire takes place under the control of the circuit 2 and using a protocol defined for this type of memory.

The second wire conveys a clock signal from the circuit 2 to the memory 1.

In addition to its functions of processing the meter values received from the microprocessor of the franking machine and of addressing the memory space 1 as mentioned above, the circuit 2 has functions suitable for properly operating the franking machine fitted with this meter memory. These functions, like the above-described functions, are defined by the program ROM 9 and are performed by the control data RAM (or working memory) 8. They are essentially constituted by the following:

- each time the franking machine is switched on, detecting which one of the 30 two-meter compartments 601 to 630 in the zone 6 contains the value of the up meter and of the down meter corresponding to the most recent franking operation (i.e. the less significant portion of said meter value as recorded therein); and
- on each franking operation, reconstituting the full value of each of the up and down meters to which the value of the most recent postage stamp is to be added or subtracted, depending on the nature of the meter.

These two functions correspond to two specific programs in the ROM 9 and are described below and are respectively called the switch-on program and the meter read/write program.

The switch-on program serves to look through the 30 compartments of the zone 6 to establish which one of them relates to the most recently performed franking operation.

The looked-for compartment is the one having the highest value for the up meter, or in a variant the lowest value for the down meter if it is possible to ignore the fact that the most recent operation could have been reloading the franking machine with credit.

Figure 4:
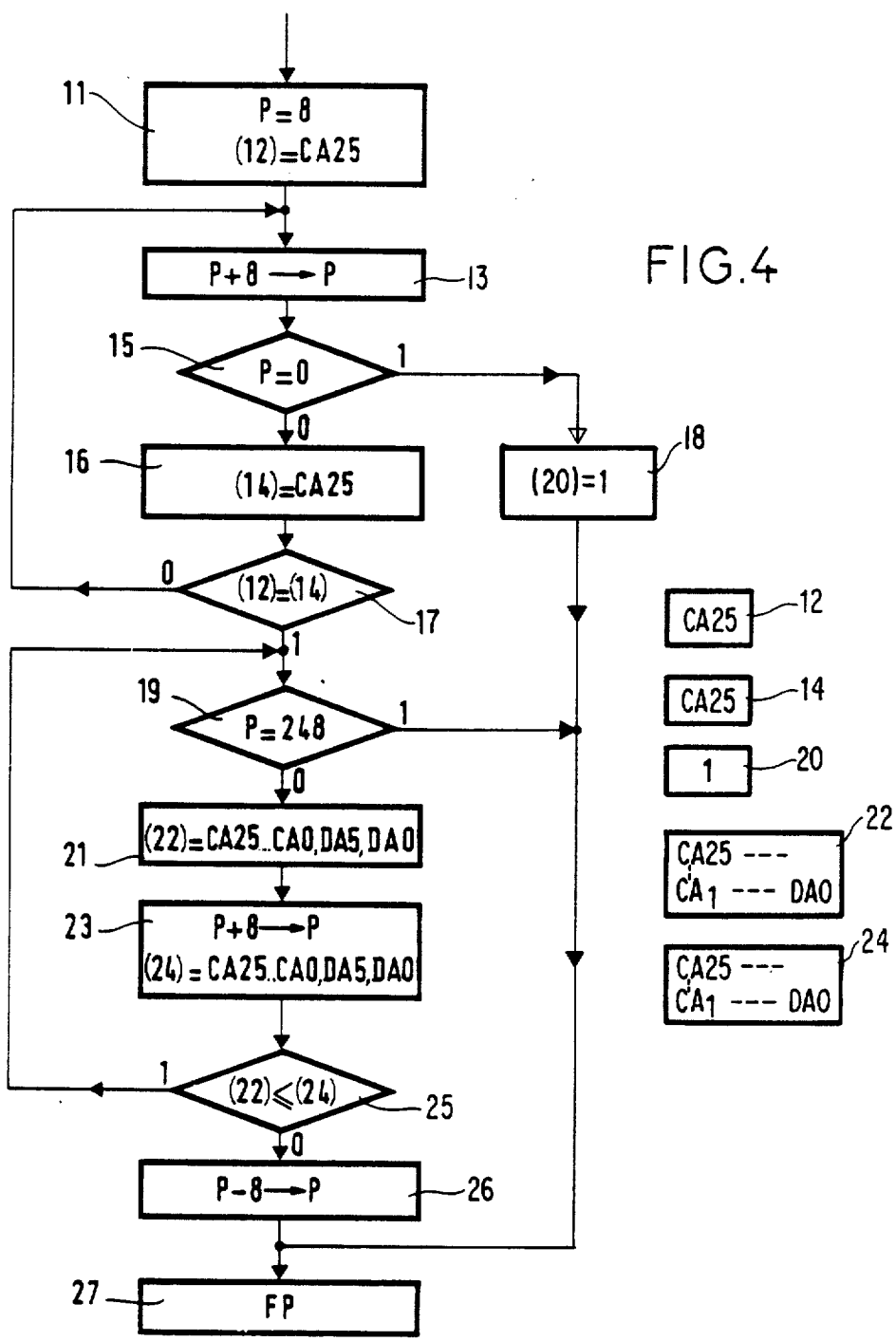
FIG. 4 is a control flow chart applicable to FIG. 3.

The operation of the switch-on program is illustrated by the flow chart of FIG. 4 which concerns seeking the address aP of the two-meter compartment having the highest up meter value stored therein. The program is defined in the ROM 9 as successive instructions. In order to run the program, the RAM operates as an address pointer for reading bytes in the memory space, and provides two buffer memories and a "fault" memory, each of which occupies one bit and is referenced 12, 14, and 20 respectively, together with two auxiliary memories each occupying four bytes and referenced 22 and 24, said memories being associated with the FIG. 4 flow chart, in order to facilitate understanding of how the program runs.

The instructions and the flow of the program are described below with reference to the organization of memory space 1 as shown in FIG. 3. In FIG. 4, decision stages are represented by diamond-shaped lozenges; outputs marked with a 0 mean "no" and outputs marked with a 1 mean "yes".

Instruction 1 or initialization instruction:
set the address pointer to 8, read the byte in the pointed-to address, extract the bit CA25 from the up meter and store it in the first 1-bit buffer memory, 12, in a stage 11 marked $P=8$, $(12)=CA25$;
move on to instruction 2.

Instruction 2:
add 8 to the address previously designated by P, as shown diagrammatically at stage 13 marked $P+8\rightarrow P$ in order to designate the new current address P;

compare the new current address P with 0 during a stage 15 marked $P=0$, and
if $P=0$ move on to instruction 3;
else P is not 0, read the byte at address P, extract the bit CA25 from said byte and store it in the second 1-bit buffer memory, 14, during a stage 16 marked $(14)=CA25$;
compare the contents of memories 12 and 14 in a stage 17 marked $(12)=(14)$;
if they are different loop to instruction 2;
else if they are identical move on to instruction 4.

Instruction 3:
load the EEPROM fault memory 20; with a "1" at a stage 20 marked $(20)=1$;
move on to the end of the program FP, at stage 27.

Instruction 4:
compare P with 248 in stage 19, marked $P=248$; and
if $P=248$, P is the address of the two-meter compartment containing the maximum value of the up meter, so go do end of program FP;
else P is not equal to 248, so go to instruction 5.

Instruction 5:
read the four bytes of memory space at the address designated by P and store the bits belonging to the up meter in the first 4-byte auxiliary memory 22 during a stage 21, marked $(22)=CA25, \ldots, CA0, DA5, \ldots, DA0$;
add $+8$ to P, and read the four bytes from the newly designated address and store the bits belonging to the next up meter in the second 4-byte auxiliary memory 24, during a stage 23 marked $P+8\rightarrow P$, $(24)=CA25, \ldots, CA0, DA5, \ldots, DA0$; and
compare the contents of memories 22 and 24 during a stage 25 marked $(22)\leq(24)$, and
if $(22)\leq(24)$, then loop to instruction 4;
else (22) is greater than (4) so go to instruction 6.

Instruction 6:
subtract 8 from the designated address P during a stage 26, marked $P-8\rightarrow P$, with the new current address designated by P being the address of the two-meter compartment in zone 6 which contains the maximum up meter value, and in which the recording corresponding to the last franking operation taken into account was made; and
go to end of program FP.

While this program is running, if CA25 in memories 12 and 14 remain different, then the designated current address P successively takes the values 8, 16, 24, 32, . . . , 248, 0.

The zone 6 has then been scanned completely without detecting the looked-for address. If $P=0$, the EEPROM fault memory is set to "1", thereby moving on to the end of the the program FP.

When the machine is switched on, ROM 9 also causes the wear recording compartment 56 to be read. A wear meter in the RAM 8 is then initialized with the old value read from the compartment 56.

During operation of the franking machine, each time a record is written to the first compartment, the state of the wear meter increases by unity, i.e. 1 is added to the old value recorded in compartment 56.

The wear meter is not materialized in the RAM 8. It comes directly from the meter read/write program.

The meter read/write program serves to generate new meter values and to record them in memory space 1 each time a franking operation takes place. It also serves to control changes in the wear data U recorded in compartment 56.

Figure 5A:
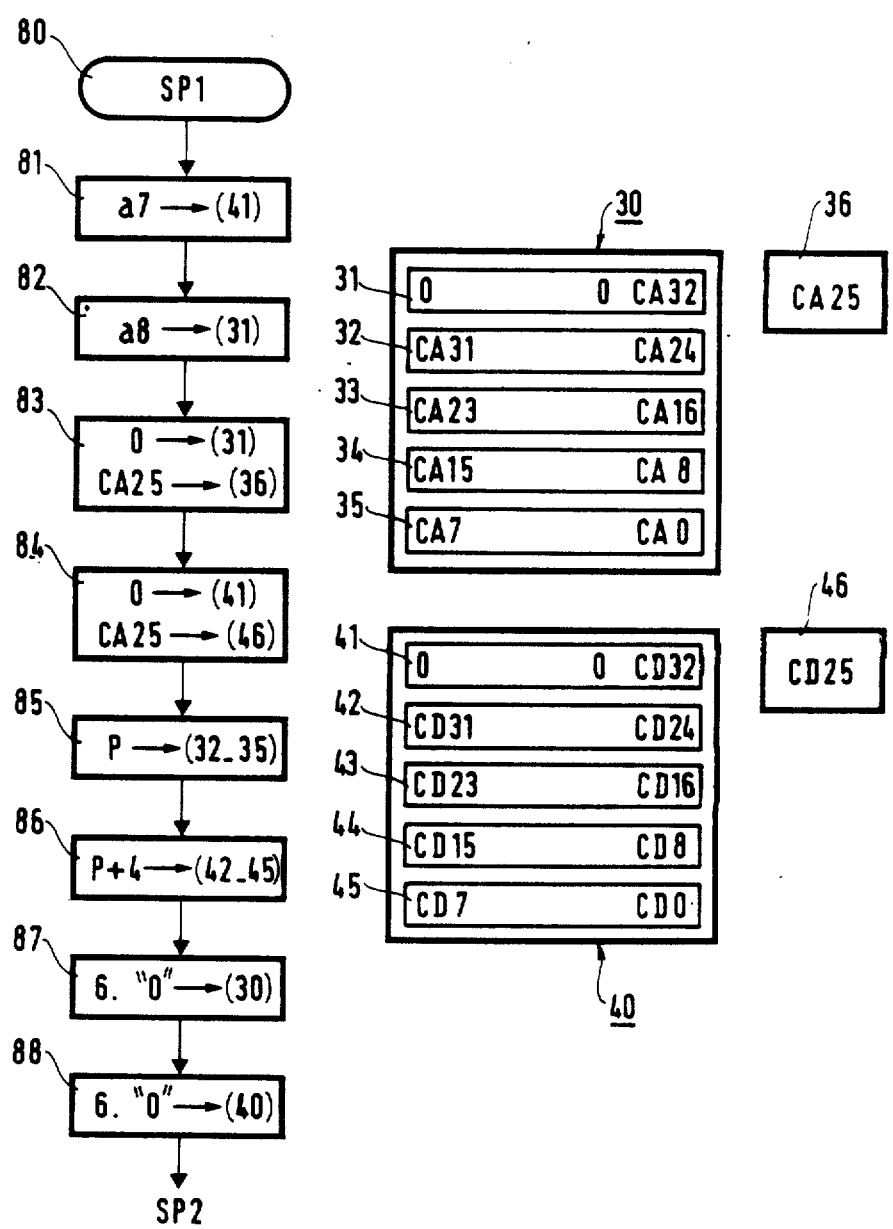
FIGS. 5A, 5B, and 5C constitute another control flow chart associated with FIG. 3.
Figure 5B:
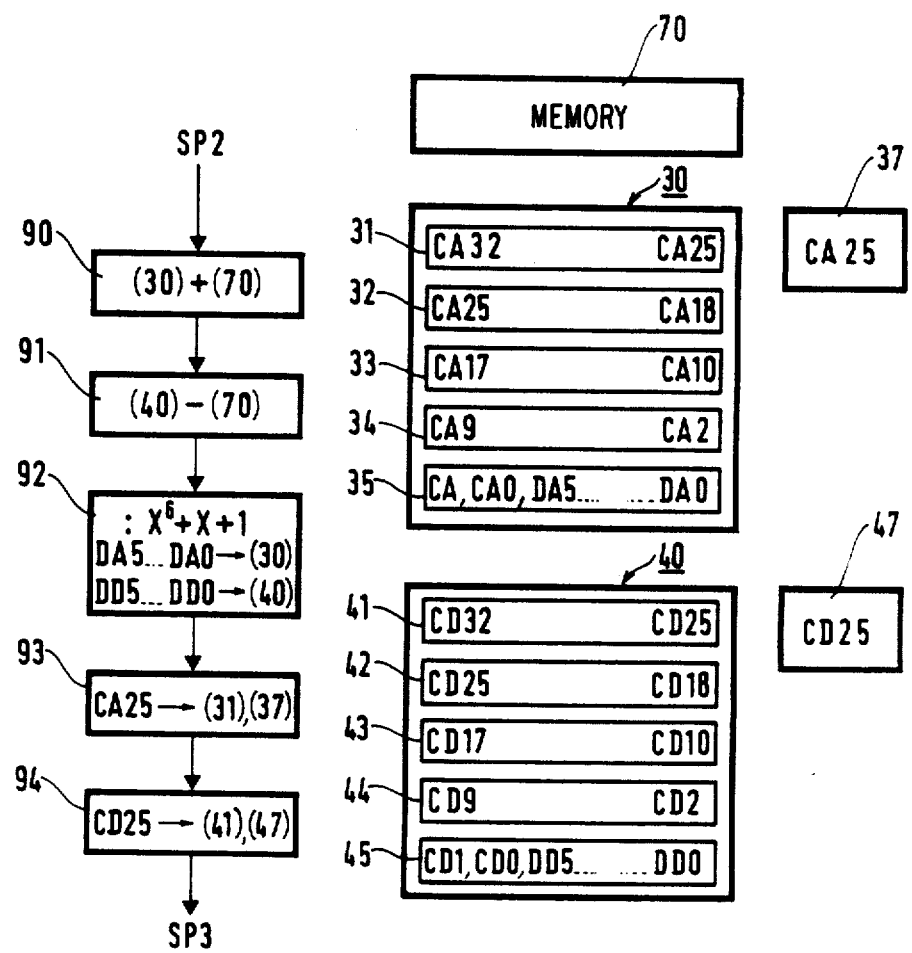
Figure 5C:
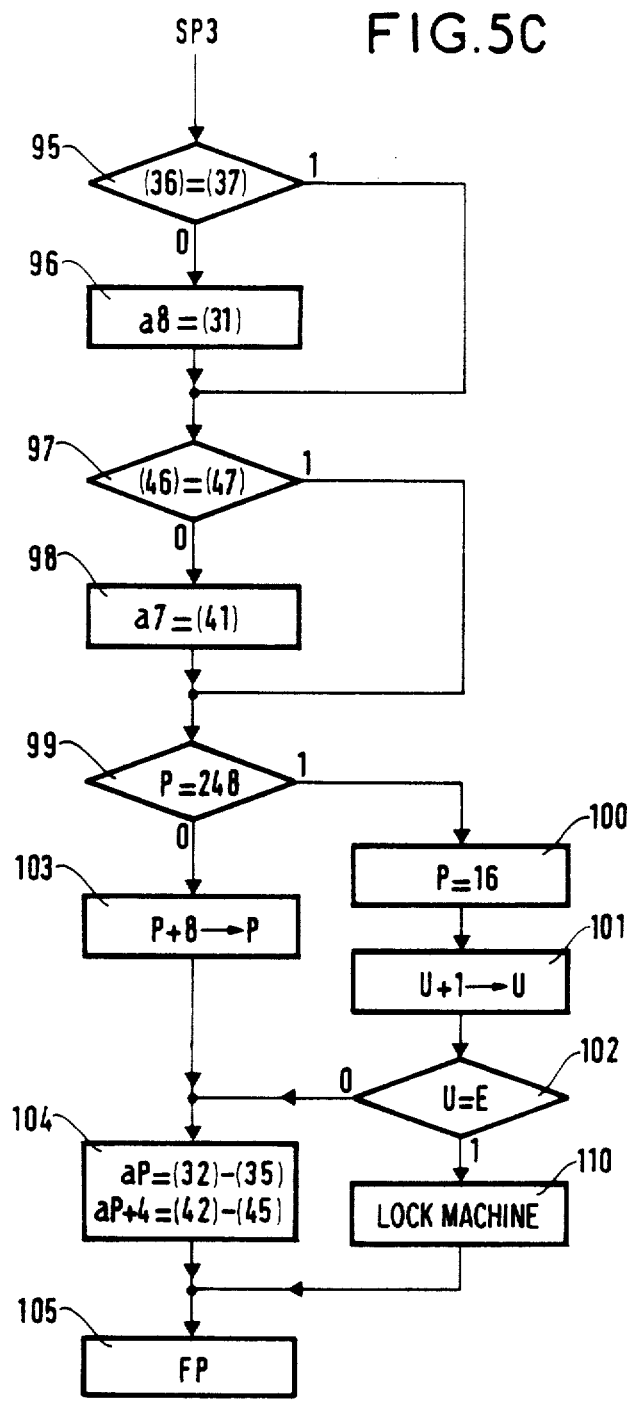

The flow of this program is illustrated by the flow chart of FIGS. 5A, 5B, and 5C which correspond to three subprograms SP1, SP2, and SP3 which are performed one after the other. This program is stored in ROM 9 and it is executed by the RAM likewise operating as an address pointer designating the read or write address P in the zone 6, where P takes one of the following possible values: 16; 24; ...; 240; and 248. For this to take place, the RAM 8 also includes, as shown in association with the flow charts of FIG. 5A to 5C:

two auxiliary memories 30 and 40 corresponding to the up meter and to the down meter respectively and each comprising five bytes comprising five one-byte registers 31 to 35 or 41 to 45, depending on which memory is concerned;

a two-byte "franking" memory 70 for storing the franking amount to be accounted; and a plurality of 1-bit buffer memories, which are chosen to be four in number and referenced 36, 37, 46, and 47 in order to illustrate their operation, but which could be chosen to be two in number.

The successive instructions and the running of the meter read/write program as shown split into successive subprograms SP1, SP2, and SP3, are described below with reference to FIGS. 5A, 5B, and 5C together with the data memory space organization shown in FIG. 3. In FIGS. 5A and 5B, decision stages are likewise represented by lozenges, with outputs marked with a 0 indicating "no" and outputs marked with a 1 indicating "yes".

Whenever a new franking operation is triggered, an initialization stage 80 takes place.

SP1 is a subprogram for reconstructing the most recent exact values of the up and down meters in the registers 30–35 and 40–45 of the auxiliary meter memories 30 and 40:

Instruction 1:
the address of the most significant byte of the down meter, a7, is designated and loaded into register 41 of the down meter auxiliary memory 40 during a stage 81 marked a7→(41);

the most significant byte of the up meter a8 is designated and loaded into register 31 of the auxiliary up meter memory 30, during a stage 82 marked a8→(31); and move on to instruction 2.

Instruction 2:
shift the contents of register 31 one place towards the least significant end and force its most significant bit to "0" while eliminating CA25 loaded in the first 1-bit buffer memory during a stage 83 marked 0→(31), CA25=(36); and shift the contents of register 41 one place towards the least significant end and force its most significant bit to "0" while eliminating the bit CD25 loaded in the second 1-bit buffer memory 46 during a stage 84 marked 0→(41), CD25=(46).

At this stage, the contents of registers 31 and 41 are as follows:

(31): 0 CA32 CA31 CA30 CA29 CA28 CA27 CA26; and
(41): 0 CD32 CD31 CD30 CD29 CD28 CD27 CD26.

Instruction 3:
read the four bytes of the current address P designated by the pointer for the most recent recording and load them into registers 32 to 35 of the up meter auxiliary memory 30, during a stage 85 marked P→(32–35); and read the next four bytes and load them into registers 42 to 45 of the auxiliary down meter memory 40 during a stage 86 referenced P+4→(42–45).

At this stage, the contents of the registers of the two memories 30 and 40 are as follows:

| | |
|---|---|
| (31): 0 CA32 | CA26 |
| (32): CA25 | CA18 |
| (33): CA17 | CA10 |
| (34): CA9 | CA2 |
| (35): CA1 CA0 DA5 | DA0 |
| (41): 0 CD32 | CD26 |
| (42): CD25 | CD18 |
| (43): CD17 | CD10 |
| (44): CD9 | CD2 |
| (45): CD1 CD0 DD5 | DD0 |

Instruction 4:
shift the bits of the five bytes of registers 31–35 one place to the right and insert a "0" in the highest bit place of register 31, while transferring the least significant bits from each register to the most significant bit of the next register and losing the least significant bit of register 35, repeat the above operation five times, as shown in stage 87 marked 6. "0"→(30); and shift the five bytes of registers 41–45 one place to the right while inserting a "0" in the most significant bit of register 41 and transferring the least significant bit of each register to the most significant bit of the following register and losing the least significant bit of register 45 during a stage 88 marked 6. "0"→(40).

At this stage, the contents of the two auxiliary meter memories 30 and 40 are those marked in said memories as shown in association with the FIG. 5A flow chart.

The contents give the exact value of the up meter and the down meter at the end of the preceding franking operation.

Subprogram SP2 is run at the end of instruction 4.

SP2 - a subprogram for generating the new values to be recorded for the up and down meters in accordance with the flow chart of FIG. 5B, with which memories 30, 40, 70, 37, and 47 are associated.

Instruction 5:
add the franking value to be taken into account as recorded in franking memory 70 to the contents of the auxiliary up meter memory 30 and store the result in registers 31–35 during a stage 90 marked (30)+(70);

subtract the franking value from the contents of the auxiliary down meter memory 40 and store the result in its registers 41–45 during a stage 91 marked (40)–(70); and move on to instruction 6.

Instruction 6:
calculate the error detection word associated with each of the new up and down meter results by dividing these results by a primitive irreducible polynomial $X^6+X+1$ and by taking the 6-bit remainder and loading the error detection word into the least significant bits of memories 30 and 40 by shifting their previous contents towards the more significant end and transferring bits from one register to the next, in a stage 92 marked: $X^6+X+1$, DA5 ... DA0→(30), DD5 ... DD0→(40); and move on to instruction 7.

The contents of the memories are thus analogous to those indicated at the end of instruction 3.

Instruction 7:
  read the most significant bit of register 32, CA25, and write it as the least significant bit of register 31 while shifting its contents one place to the left, and also write it into buffer memory 37 in a stage 93 marked CA25→(31), (37); and
  read the most significant bit of register 42, CD25, and write it as the least significant bit of register 41 while shifting its contents one place to the left and also writing it to buffer memory 47, in a stage 94 marked CD25→(41), (47).

The memories 30 and 40 shown in association with the flow chart of FIG. 5B contain, as shown, the new values to be recorded in meter memory space 1 together with their redundancy bits CA25 and CD25 and their error detection words. The end of instruction 7 causes recording subprogram SP3 to be run.

SP3 - subprogram for recording in memory space 1.
Instruction 8:
  compare the contents of buffer memories 36 and 37 during a stage 95 marked (36)=(37), and
  if the contents are identical move on to instruction 9;
  else if the contents are different, designate address a8 of memory space 1, erase the designated byte, and record the contents of register 31 in said address, during a stage 96 marked a8=(31), then move on to instruction 9.

Instruction 9:
  compare the contents of buffer memories 46 and 47, during a stage 97 marked (46)=(47), and
  if the contents are identical move on to instruction 10;
  else if the contents are different, designate address a7 of memory space 1, erase the designated byte and record the contents of register 41 at this address during a stage 98 marked a7=(41) and then pass on to instruction 10.

Instruction 10:
  compare the address P of the last recording in zone 6 with 248 during a stage 99 marked P=248, and
  if P=248:
  set P=16, in order to loop back to the next address in the sequence in zone 6 in a stage 100 marked P=16;
  read the 2-byte wear compartment 56 at addresses a5 and a6 and increment by +1 the wear data word U read therefrom, erase the wear compartment and record the new wear word during a stage 101 marked U+1→U; and
  compare the value U with a maximum value in a stage 102 marked U=E, and lock up the machine if U=E during a stage 110;
  else if P is not equal to 248, add 8 to P during a stage 103 marked P+8→P;
  after stage 103, or if P≠3 at stage 102, move on to instruction 11 at stage 104.

Instruction 11:
  erase the eight successive bytes designated by P, record the contents of registers 32 to 35 in the locations of the first four bytes and the contents of registers 42 to 45 in the locations of the next four bytes during a stage marked aP=(32)–(35), aP+4=(42)–(45).

After either of steps 104 or 110, execution advances to stage 105 which constitutes the end of this instruction and the end of subprogram SP3 in the complete read-/write program.

The meters in the EEPROM are then updated.

While this program is running, the buffer memories 36 and for the bits CA25, one of which has already been recorded and the other of which is to be recorded, may be replaced by a single buffer memory.

In this case, during instruction 7, bit CA25 as read from register 32 and the bit then contained in memory 36 may be directly compared in order to reset the memory 36 to "0" if they are identical and to set it to "1" if they are different.

The same applies to memories 46 and 47.

Instructions 8 and 9 then make direct use of these results for their comparisons.

There are numerous advantages in using a limited EEPROM memory space in the manner described above as the meter memory for a franking machine. In addition to the fact that the meter memory is non-volatile, the following may be mentioned:

it may be used without backing-up throughout the lifetime of the most usual franking machines which are provided for performing 300,000 franking operations over a period of ten years;
  this period of use is measured and the machine is locked up where necessary;
  the increased amount of recorded data including the up and down meter values makes it possible to record, using these two meters, the cumulating meter and the error detection word applicable to each meter value for the purpose of security checking; and
  it is possible to increase the capacity of the machine meters, in particular by one byte per meter, with the cumulating meter and the two most significant bytes of the up meter and the down meter then being stored in the fixed address zone while the spare compartment is reduced by three bytes.

A franking machine fitted with a meter memory in accordance with the present invention also has the advantage of even greater security.

In addition to the cumulating meter and the error detection words recorded together with the up and down meters, the machine may be fitted with two meter-memories which are identical to the single memory described above, and if the contents of these two memories do not match, then machine operation may be locked up at any moment. Further, in the present application, if a fault occurs due to a breakdown, the meter memory or both meter memories retain the most recently recorded values, giving the recent history of machine use. This history makes it possible to reconstitute the state of the machine immediately prior to the breakdown and facilitates establishing a satisfactory compromise between the postal administration and the user when attempting to obtain a reliable status for the meters immediately prior to breakdown.

The redundancy bit added to the exact value of each meter between the more significant bits recorded in the fixed address zone 5 and the less significant bits recorded in the changing address zone 6 makes detecting the last recorded value easy and quick. This detection is performed only on the compartments in the zone 6 which have the same redundancy bit as the corresponding compartment 51 in the zone 5.

I claim:

1. A limited-write non-volatile memory for recording successive data sets each comprising m bits, and each having the possibility of being renewed R times, the memory comprising:

a memory device which can be addressed for a maximum number E of times for writing at each address, said memory having a limited memory space attributed to said data sets and defining a capacity which is less than the capacity required for renewing said data sets R times;

said limited memory space being organized as a first zone for recording n of the m bits in each data set at first fixed addresses in said first zone, said n bits requiring renewing fewer than E times, and a second zone for recording the remaining m−n bits in each data set at variable second addresses within said second zone, together with at least one of the n bits of the set under consideration, referred to as a redundancy bit; and said memory further including a programmed circuit for processing and controlling the addressing of said limited memory space, said circuit causing said first fixed addresses to be designated for recording said n bits in the place of the preceding n bits only on occasions that said n bits are altered; and also causing a second, variable address to be designated for recording said m−n bits together with at least one associated redundancy bit on each occasion that a new data set is to be recorded, said designated second address being the next second address in a closed loop sequence including all of said second addresses.

2. A memory according to claim 1, wherein said programmed circuit further includes means for counting the number of successive loops completed through said sequence of said variable second addresses, thereby constituting a wear meter.

3. A memory according to claim 2, comprising, in said first zone, a first compartment of at least n bits defined in said first fixed addresses, and at least one second "wear" compartment defined at third fixed addresses in said first zone for recording said wear meter, and wherein said programmed circuit also controls the designation of said third fixed addresses each time a new state of the wear meter occurs in order to record said new state instead of the previous state.

4. A franking machine including means that generate successive overall values of the franking operations performed, said franking machine including a limited-write non-volatile memory system for recording successive data sets each comprises m bits, and each having the possibility of being renewed R times the memory system comprising:

a memory device which can be addressed for a maximum number E of times for written at each address, said memory having a limited memory space attributed to said data sets and defining a capacity which is less than the capacity required for renewing said data sets R times;

said limited memory space being organized as a first zone for recording n of the m bits in each data set at first fixed addresses in said first zone, said n bits requiring renewing fewer than E times, and a second zone for recording the remaining m−n bits in each data set at variable system addresses within said second zone, together with at least one of the n bits of the set under consideration, referred to as a redundancy bit; and said memory system further including a programmed circuit for processing and controlling the addressing of said limited memory space, said circuit causing said first fixed addresses to be designated for recording said n bits in the plate of the preceding n bits only on occasions that said n bits are altered; causing a second, variable address to be designated for recording said m−n bits together with at least one associated redundancy bit on each occasion that a new data set is to be recorded, said designated second address being the next second address in a closed loop sequence including all to said second addresses; and also counting the number of successive loops completed through said sequence of said variable second addresses, thereby constituting a wear meter, wherein said limited memory space constitutes the up meter memory of the franking machine, for which the successive total values of the franking operations performed constitute said successive data sets, and in which said programmed circuit include means for locking said machine when said wear meter reaches the maximum number E of writes.

5. A franking machine according to claim 4, wherein said redundancy bit for each data set is situated at the junction between the bits recorded in said first zone and the bits recorded in said second zone.

6. A franking machine according to claim 5, wherein said programmed circuit, each time said machine is switched on, detects the last data set to have been recorded in said limited memory space.

7. A franking machine according to claim 6, wherein said programmed circuit reads and copies said redundancy bit from said first zone, reads and copies said redundancy bit from successive compartments in said second zone compares said redundancy bit as copied from said first zone and as copied from each compartment in said second zone, and detects the highest-content second zone compartment from amongst the compartments of the second zone which have the same redundancy bit as the redundancy bit copied from the first zone.

8. A franking machine according to claim 5, wherein the programmed circuit generates and writes a new data set in response to each franking operation.

9. A franking machine according to claim 8, wherein said programmed circuits generates and writes a new data set by reconstructing the exact value of the last-recorded data in said first and second zones generating said new data set to be recorded comparing said redundancy bit belonging to the last-recorded set with the redundancy bit belonging to the newly generated set to be recorded, with the result of said comparison determining whether addressing is performed within said first zone at first fixed addresses and changing the variable addresses of said second zone on the basis of said the last recording in said second zone in order to write address said second zone.

10. A franking machine according to claim 9, wherein said programmed circuit changes said variable addresses in accordance with the last possible recording in said series of addresses in said second zone.

11. A franking machine according to claim 4, further comprising means for generating successive values of available credit remaining in the machine, wherein said limited memory space also constitutes the down meter memory of the franking machine for which the successive values of remaining credit associated with the successive franking values form successive meter value pairs which constitute said successive data sets, wherein said first zone is organized for consecutive recording of at least one most significant byte of each of the values in a pair at said first fixed addresses, and wherein said second zone is subdivided into an integer number of mutually identical two-meter compartments for consecutively recording at least the remaining less significant bits of both values in a given pair.

12. A franking machine according to claim 11, wherein said limited space is space in a serial access EEPROM in which said first zone comprises, at fixed addresses: a compartment for a credit cumulating meter; a compartment for a wear meter for measuring usage of the memory itself; and a two-meter compartment for the more significant bits of the up meter and the down meter; and in which said second zone comprises an integer number of identical two-meter compartments for at least the less significant remaining bits of the up meter and the down meter successively associated with the two-meter compartment of said first zone for defining said up and down meters.

13. A franking machine according to claim 11, wherein said programmed circuit further includes means for generating an error detection word applicable to each of the values of each pair and which is associated with the corresponding value to be recorded together therewith in said second zone.

14. A franking machine according to claim 13, wherein the error detection word is obtained by dividing each of the values by a primitive irreducible polynomial $X^6 + X + 1$.

15. A franking machine according to claim 14, wherein each of the values of a given pair is recorded together with said redundancy bit and said error detection word associated therewith as an integer number of bytes.

16. A franking machine according to claim 11 and further including means for generating successive total values of successive credit amounts attributed to said machine, wherein said limited memory space further includes, in said first zone, a third compartment defined at fourth fixed addresses in said first zone for recording successive total credit values and constituting the cumulative meter memory of the machine, and wherein said programmed circuit further controls the addressing of said fourth compartment for each new credit value in order to record it at said fourth fixed addresses in place of the preceding value.

17. A franking machine according to claim 16, wherein said limited memory space comprises 256 bytes and wherein said second zone is divided into 30 two-meter compartments each comprising eight bytes.

18. A franking machine according to claim 16, wherein in said limited memory space, said second zone comprises a number of compartments which is a function of said memory space and the expected number of franking operations to be performed by said machine, for a given maximum number E of writes possible in said memory space.

* * * * *